United States Patent

Murakami

[11] 3,944,991
[45] Mar. 16, 1976

[54] MAGNETIC DOMAIN MEMORY ORGANIZATION

[75] Inventor: Hiroshi Murakami, Tokyo, Japan

[73] Assignee: Nippon Electric Company, Ltd., Tokyo, Japan

[22] Filed: July 12, 1974

[21] Appl. No.: 487,945

[30] Foreign Application Priority Data
July 12, 1973 Japan.............................. 48-79012
July 31, 1973 Japan.............................. 48-86613
July 31, 1973 Japan.............................. 48-86614
July 31, 1973 Japan.............................. 48-86615
July 31, 1973 Japan.............................. 48-86616

[52] U.S. Cl. 340/174 TF; 340/174 SR; 340/174 M
[51] Int. Cl.² ................. G11C 11/14; G11C 19/08
[58] Field of Search ................ 340/174 TF, 174 SR

[56] References Cited
UNITED STATES PATENTS 3,701,132  10/1972  Bonyhard et al............. 340/174 TF
3,792,450  2/1974  Bogar et al.................... 340/174 TF Primary Examiner—Stanley M. Urynowicz, Jr.
Attorney, Agent, or Firm—Sughrue, Rothwell, Mion, Zinn & Macpeak

[57] ABSTRACT

The insertion of new data into a major-minor loop memory is effected by selectively controlling the passage of bubbles through at least two gates provided between a bubble generator and the major loop. In a two-dimensional array of such memories, the write process is initiated by first applying a transfer signal to a selected row of the memories to transfer the data in the row into their respective major loops for subsequent erasure. Then, a gate signal is applied to a first gate of each memory in the selected row to condition it for write. Another gate signal is applied to a second gate of each memory in a selected column in accordance with the data to be inserted. This arrangement permits new data to be inserted into only the memory of the array that is located at the intersection of the selected row and column.

11 Claims, 7 Drawing Figures

MAGNETIC DOMAIN MEMORY ORGANIZATION

BACKGROUND OF THE INVENTION

The present invention relates to a magnetic domain memory system and more particularly, to a novel magnetic domain memory unit and a memory system of the kind employing a plurality of such units.

A major-minor memory loop chip composed of magnetic domain memory elements is shown in FIG. 1 of U.S. Pat. No. 3,618,054 (Reference 1). This chip construction was proposed to achieve a high access speed without sacrificing a memory density. Throughout the following description, in order to avoid ambiguity in terminology, the term "a magnetic momory unit" or simply "a unit" will be used to represent an arrangement comprising a sheet of magnetic material on which is formed a combination of one major loop having input and output sections and a plurality of minor loops for holding and moving magnetic domains. In order to realize a magnetic domain memory system with a required memory capacity, a large number of such units must be used.

A memory system construction in which such units are arranged in rows and columns, is disclosed in an article by Hsu Chang Bubble Domain Memory Chips IEEE TRANSACTIONS ON MAGNETICS, VOL. MAG-8, No. 3 Pages 564 to 569, especially Pages 564 to 565 (FIG. 2), September issue, 1972 (Reference 2). In this memory system construction, when a gate current is fed to a WRITE-gate conductor in response to a write-in command, magnetic domains enter into the major loop of the unit located in the selected column as well as those of the units in the unselected columns. Therefore, after the write-in operation for the selected unit has been completed, the unwanted magnetic domains thus present in the major loops of the unselected units must be erased by feeding a gate current to an ERASE-gate conductor. As a result, the write-in period is fairly long. If a request for read-out should occur while the unwanted domains are being erased, the immediate read-out operation is impossible. Since the memory system construction employing the conventional memory units has the above-mentioned disadvantage, has been desired such that a novel chip construction has been desired such that which prevents the entering of domains into the major loops of unselected units during the write-in operation If it is assumed that the memory capacity of a unit, that is, the product of the number of bits in each minor loop and the number of minor loops is equal to B bits, the average access time required for reading out arbitrary information in a minor loop of the magnetic domain memory unit is approximately proportional to B. For this reason, in order to reduce the average access time, the value of B must be made small. However, this results in an increased number of the units in the magnetic memory system. With regard to the magnetic domain memory system of such construction the units that are arranged in rows and columns as disclosed in Reference 2, if the number of rows and that of columns in the row-column arrangement are chosen so as not to extremely differ from each other, the numbers of TRANSFER-gate driver circuits, ERASE-gate driver circuits, WRITE-gate driver circuits and READ-amplifiers as required are approximately proportional to the square root of the total number of the units. In this case, the number of simultaneously operating units is equal to that of the rows in the row-column arrangement.

If the memory system having the above-described construction is so designed as to operate intentionally and simultaneously the units equal in number to the number of rows in the row-column arrangement to meet the required data transfer rate, there exists no problem with respect to the system construction. However, in an extreme case, if only the data rate satisfied by the operation of only one unit is required, it is not economical to practically provide the READ-amplifiers equal in number to the rows in the row-column arrangement. On the other hand, if the number of the rows in the arrangement is determined so as to match the required data transfer rate, the number of the TRANSFER-gate driver circuits is increased, although the number of the READ- amplifiers can be minimized. Therefore, the development and the realization of a magnetic domain memory unit as well as a magnetic domain memory system employing such units and having the system construction free from the above-mentioned disadvantages have been desired.

SUMMARY OF THE INVENTION

It is, therefore, one object of the present invention to provide a novel magnetic domain memory unit and a magnetic domain memory system using the same which is free from the above-mentioned disadvantages inherent to the conventional magnetic domain memory unit and the memory system employing the same.

The present magnetic domain memory unit has a chip construction of a major-minor loop system including an input section having a plurality of signal lines.

Also, according to another feature of the present invention, the above-mentioned magnetic domain memory unit comprises: in addition to the input section, an output section consisting of a plurality of domain propagation paths provided in the major loop and arranged in parallel to each other, domain detector means and domain eraser means coupled to one of the propagation paths, and control means for allowing domains to be transferred to one of the plurality of propagation paths arranged in parallel.

Also, the present magnetic domain memory system comprises a memory array in which the above-mentioned magnetic domain memory units are arranged in rows and columns.

As a result, according to this invention, unnecessary transfer of domains in the major loops of unselected magnetic domain memory units during the write-in operation can be prevented and simultaneously, the reduction of the write-in period in the memory system can be attained. In addition, the access time of the memory system can be reduced without increasing the number of peripheral circuits and connections between the memory units and the peripheral circuits.

DESCRIPTION OF PREFERRED EMBODIMENTS

Figure 1:
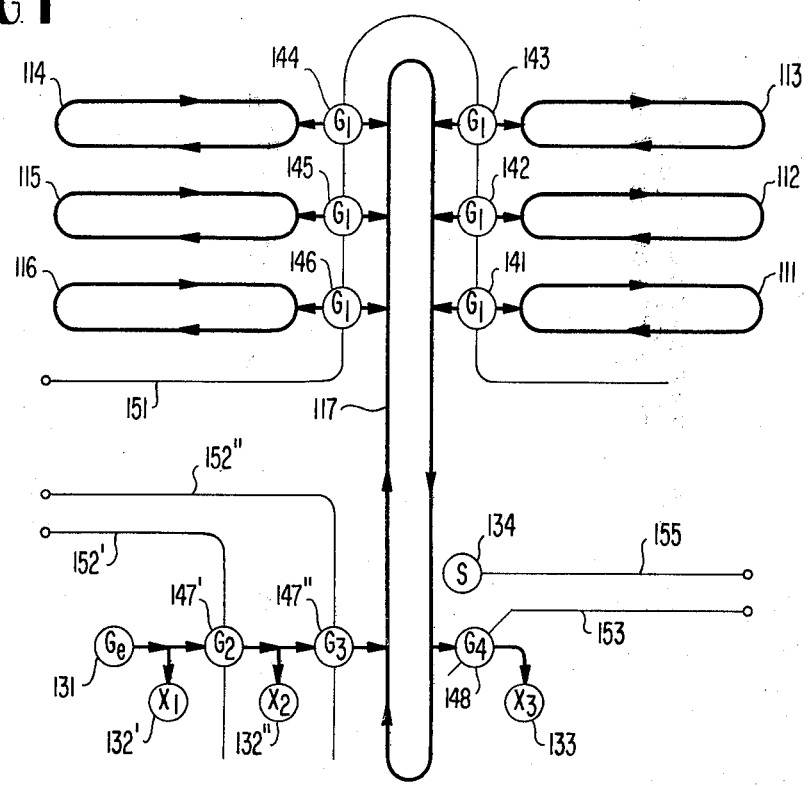
FIG. 1 shows a schematic diagram of a first embodiment of the present invention.

In FIG. 1, there is illustrated a first embodiment of a magnetic domain memory unit adapted for use in a large-scale magnetic domain memory system. In this drawing, basic elements of the memory unit are represented in a symbolized form. A circle encircling a symbol G$e$ represents a domain generator; a circle for a symbol G, a gate; a circle for a symbol S, a domain detector; and a circle for a symbol X, a domain eraser respectively. For basic elements existing in multiple, each element is distinguished from each other by adding a specific suffix to each symbol. In addition, a thick solid line represents a propagation path for magnetic domains.

The magnetic domain memory unit of FIG. 1 has minor loops 111 to 116, a major loop 117, and memory gates 141 to 146 for controlling the transfer of domains between the major loop 117 and the minor loops 111 to 116, these loops being provided on a sheet (not shown) of magnetic material capable of holding and moving magnetic domains. An input section coupled to the major loop 117 consists of a domain generator 131, domain eraser 132' and 132", gates 147' and 147" and propagation paths connecting these basic elements. A conductor 152' for the gate 147' is a first signal line of the input section, while a conductor 152" for the gate 147" is a second signal line of the input section. An output section has the same construction as that of the conventional magnetic domain unit, and includes a domain detector 134, an eraser gate 148 and a domain eraser 133. The eraser gate 148 and eraser 133 are coupled to the major loop 117. A conductor 155 for the domain detector 134 is herein called a first signal line of the output section, while a conductor 153 for the gate 148 is named a second signal line of the output section. Also, a conductor 151 is provided for the memory gates 141 to 146. Although these conductors are denoted by a single line for simplicity, actually they may be either a single conductor or both-way conductors.

In the output section, domains propagated along the major loop 117 are detected by the domain detector 134 when the read-out operation is performed, while they are erased during the write-in operation by the domain eraser 133 after having been passed through the gate 148 which is then opened. In the input section, only when two signals are applied simultaneously to the first signal line 152' and the second signal line 152", respectively, to open the gates 147' and 147", respectively, magnetic domains fed from the domain generator 131 can enter into the major loop 117. If the condition of the two signals is such that only one of the gates 147' and 147" is opened or neither of the gates is opened, the domains sent from the domain generator 131 do not enter into the major loop 117 but they are erased by the domain eraser 132' or 132". Under the state in which one of the two signals is given to open the gate 147', if the other signal is applied so as to open or close the gate 147" in accordance with write-in information, there occurs a series of domains corresponding to the write-in information, which enter into the major loop 117 through the gate 147".

Figure 2:
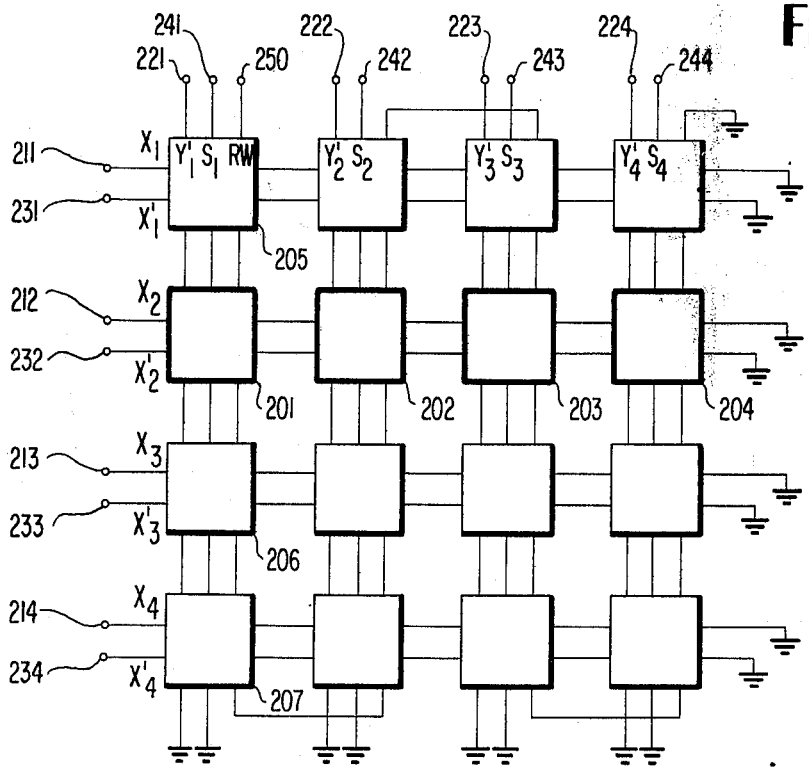
FIG. 2 shows a wiring diagram of a memory plane on which the units shown in FIG. 1 are arranged in rows and columns.

In FIG. 2 which shows a memory array of the magnetic domain memory units of FIG. 1 arranged in rows and columns, the conductors 151 (X-line) for the memory gates 141 to 146 of the units in the same row are connected to each other, and similarly, the first signal lines 152' (X'-line) of the input sections, which are the conductors for the gates 147', are connected to each other. The second signal lines 152" (Y'-line) of the input sections, which are the conductors for the gates 147" of the units, are grouped in the same column and are connected to each other, and similarly, the first signal lines 155 (S-line) of the output sections in the same column are connected to each other. The second signal lines 153 (RW-line) of the output sections, which are the conductors for the gates 148, are grouped in all the units of the row-column arrangement and are connected to each other. As the connection terminals for external circuits (not shown), X-line terminals 211 to 214, X'-line terminals 231 to 234, Y'-line terminals 221 to 224, S-line terminals 241 to 244 and a RW-line terminal 250 are provided as shown in FIG. 2.

Figure 3:
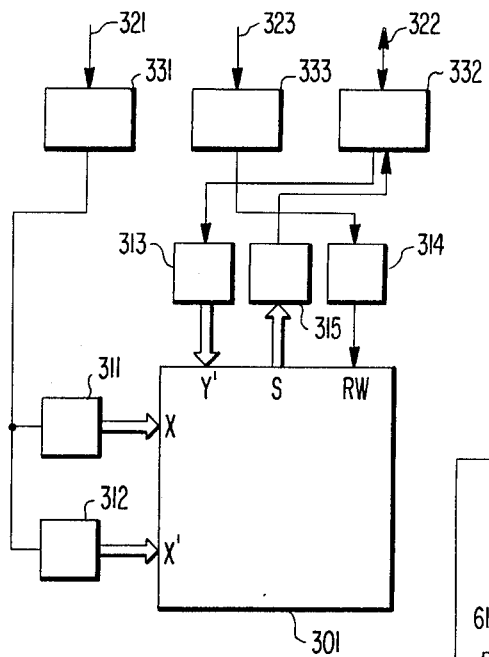
FIG. 3 shows a block diagram of a magnetic domain memory system comprising the memory array shown in FIG. 2.

In FIG. 3, the magnetic domain memory system shown comprises a memory array plane 301 of the type as shown in FIG. 2, means for applying signals to each signal line of the memory array, means for detecting signals derived from the signal lines, and control means. The respective X-lines and X'-lines of the memory array 301 are connected to an X-line selector circuit 311 and an X'-line selector circuit 312, respectively, each of which supplies a gate current to the X-line and X'-line in a selected row in accordance with each address information. The respective Y'-lines of the memory array 301 are connected to a Y'-line driver circuit 313 for feeding signals represented by the presence and absence of gate currents to the respective Y'-lines in all columns depending on write-in information, while the RW-line is connected to a RW-line driver circuit 314. The RW-line driver circuit 314 supplies a gate current to the RW-line during the write-in operation in accordance with write-read control information. Each S-line of the memory array 301 is connected to an amplifier-shaper circuit 315 for amplifying and shaping detected signals appearing on the S-lines. In contrast to the fact that the X-line selector circuit 311 and the X'-line selector circuit 312 give gate currents to the X-line and X'-line of the units in a particular row selected in accordance with the address information, the Y'-line driver circuit 313 feeds the respective gate currents to the Y'-lines in all the columns of units of the memory array 301 according to the write-in information. The amplifier-shaper circuit 315 serves to amplify and shape the detected signals appearing on all the S-lines equal in number to the Y-lines.

Address information given from external circuits (not shown) is set in an address register 331 via a terminal 321, write-in information is set in an information register 332 via a terminal 322, read-out information is fed from the information register 332 via the terminal 322 to the external circuits, and write-read control information and a master timing signal are applied to a control circuit 333 via a terminal 323. The address information is given from the address register 331 to the X-line selector circuit 311 and the X'-line selector circuit 312. The write-in information is supplied from the information register 332 to the Y'-line driver circuit 313. The write-read control information is fed from the control circuit 333 to the RW-line driver circuit 314. Also, though various timing signals are produced in response to the write-read control information and the master timing signal fed through the terminal 323 and are sent from the control circuit 333 to the respective circuits, these timing signals are omitted for simplicity of the drawing.

Next, the operation of the magnetic domain memory system shown in FIG. 3 will be described with reference to FIGS. 1 and 2. Let it be assumed that the memory units in the second row of the memory array 301 are selected. In the write-in operation, a gate current is given from the X-line selector circuit 311 to the terminal 212 for the conductors 151 $X_2$-line) of the units 201 to 204 in the selected second row, and thereby, the memory gates 141 to 146 in the units 201 and 204 are opened to transfer to the major loops 117 the information currently stored in minor loops 111 to 116. Then, by supplying a gate current from the RW-line driver circuit 314 to the terminal 250 for the conductors 153 (RW-line) of all the units to open the gates 148, the magnetic domains entering into the respective major loops 117 are erased by the domain erasers 133 in the respective units. In this way, the minor loops of the selected units 201 to 204 are prepared for subsequent storage at particular memory domain positions.

In coincidence with the operation of erasing the magnetic domains in the major loops of the selected units 201 to 204, a gate current is sent from the X'-line selector circuit 312 to the terminal 232 for the conductors 152' ($X_2$'-line) of the second row units to open the gates 147' in the units 201 to 204. Simultaneously, by supplying signals represented by the presence and absence of gate currents which correspond to "1" and "0", respectively of the write-in information, to the terminals 221 to 224 for the conductors 152" ($Y_1$'-line to $Y_4$'-line) of the units in the first to fourth columns, the gates 147" are opened and closed. Then domains corresponding to the write-in information enter successively into the major loops 117 of only the selected units 201 to 204, and a series of magnetic domains are aligned in each of the major loops 117. On the other hand, in the units other than the units 201 to 204, the input of domains into the major loops does not occur, because the gates 147' are kept closed although the gates 147" are opened and closed. In the major loops of the second row units 201 to 204, when the series of magnetic domains corresponding to the newly written information have moved up to the positions on the respective major loops adjacent to the minor loops in which the respective domains are to be stored, a gate current is fed from the X-line selector circuit 311 to the terminal 212 to open the memory gates 141 to 146. The series of domains written in through the input section thereby occupy the memory domain positions in the minor loops 111 to 116 which have been previously made vacant.

Now, the operation of reading out information from the units 201 to 204 in the selected second row will be described. A gate current is sent from the X-line selector circuit 311 to the terminal 212 for the conductors 151 ($X_2$-line) of the second row units 201 and 204 to open the memory gates 141 to 146 in the units 201 to 204, and as a result, the information stored in particular memory domain positions in the minor loops 111 to 116 is transferred to the major loops 117 for readout.

These domains are detected by the domain detectors 134 and converted into electric signals as they move along the respective major loops. Thereafter, the series of domains move round the respective major loops almost by one revolution and are propagated up to the positions on the major loops opposed to the respective minor loops in which the respective domains are to be stored again. At this moment, if a gate current is fed from the X-line selector circui 311 to the terminal 212 to open the memory gates 141 to 146 in the units 201 to 204, then the domains on the respective major loops 117 are stored in the corresponding minor loops 111 to 116. Thus, the read-out operation has been completed.

As will be obvious from the above-mentioned read-out operation, only in the units in the selected row among the units in each column, the domains corresponding to the information to be read out are propagated along each major loop, passing through the domain detectors 134. Therefore, in spite of the fact that the conductors 155 for the domain detectors in the units in each column are connected in common to form $S_1$-line to $S_4$-line, it is possible to obtain detected signals corresponding to the domains present in the major loops of the units in the selected row from the respective S-line terminals 241 to 244.

In the memory system of FIG. 3 which employs the units shown in FIG. 1, as will be evident from the write-in operation, the input of unnecessary domains into the major loops of unselected units can be eliminated, and consequently, the write-in period has been shortened.

Figure 4:
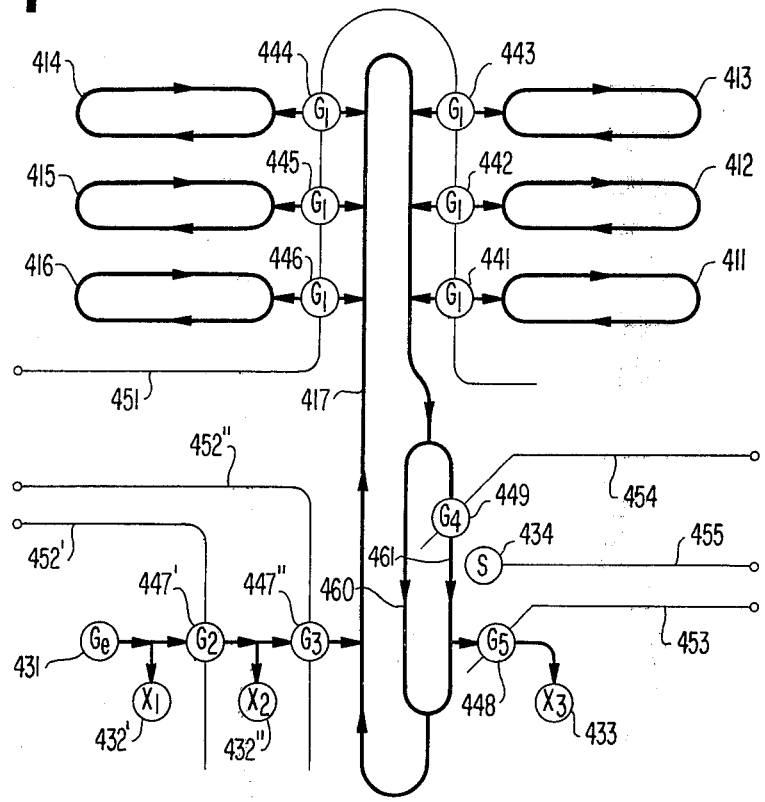
FIG. 4 shows a schematic diagram of a second embodiment of the present invention.

In FIG. 4 there is shown a second embodiment of a magnetic domain unit, which is exactly the same as that shown in FIG. 1 except for an output section. The output section of this unit consists of domain propagation paths 460 and 461 provided in a major loop 417 in parallel to each other, a domain detector 434 serving as domain detector, an eraser gate 448 and a domain eraser 433 in combination serving as domain eraser means, and a gate 449 serving as control means for controlling the domains in the major loop 417 to be transferred either to the domain propogation path 460 or to the domain propagation path 461. Accordingly, a conductor 454 for the gate 449 is a signal line for the control means in the output section. Throughout this example, the conductor 454 for the gate 449 is called a first signal line of the output section; a conductor 455 for the domain detector 434, a second signal of the output section; and a conductor 453 for the gate 448, a third signal line of the output section.

Since the operation of the unit is the same as that of the unit shown in FIG. 1 except for the output section, only the operation of the output section of the unit will be described.

If the gate 449 is not opened, magnetic domains propagated along the major loop 417 move to the propagation path 460. Then they continue to move in the major loop 417 passing the proximity of the gate 447". On the other hand, if the gate 449 is opened by feeding a gate current to the conductor 454 for the gate 449, the domains propagated along the major loop 417 are transferred to the path 461. In response to the read-out operation, the domains on the path 461 are detected by the domain detector 434, while in the write-out operation, the domains on the propagation path 461 are transferred to the domain eraser 433 via the gate 448 to be erased therein. Thus, by controlling the gate 449, the domains transferred from the minor loops 411 to 416 via gates 441 to 446 to the major loop 417 can be alternatively transferred either through the path 461 in the output section in which the domain detector means and the domain eraser means exist or through the simpler path 460 in which the domain detector means and the domain eraser means do not exist.

Figure 5:
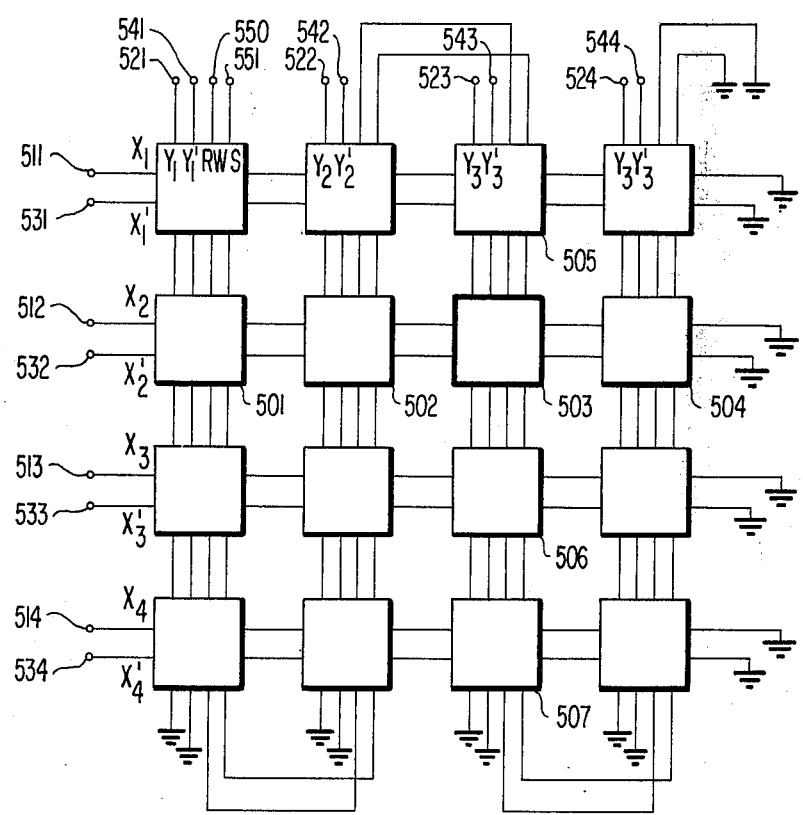
FIG. 5 shows a wiring diagram of a memory array in which the units shown in FIG. 4 are arranged in rows and columns.

In FIG. 5 which shows a memory array with a plurality of magnetic domain memory units of FIG. 4 arranged in rows and columns, the conductors 451 (X-line) for the memory gates 441 to 446 of the units in the same row are connected to each other, and similarly, the first signal lines 452' (X'-line) of the input sections, which are the conductors for gates 447', are connected to each other. The first signal lines 454 (Y-line) of the output sections which are the conductors for the gates 449, of the units in the same column are connected to each other. Also, similarly, the second signal lines 452'' (Y'-line) of the input sections, which are the conductors for the gates 44''', are connected to each other. The second signal lines 455 (S-line) of the output sections which are the conductors for the domain detectors 434, of all the units arranged in an array are connected to each other, and similarly the third signal lines 453 (RW-line) of the output sections, which are the conductors for the gates 448, are connected to each other. As connection terminals for external circuits (not shown), X-line terminals 511 to 514, X'-line terminals 531 to 534, Y-line terminals 521 to 524, Y'-line terminals 541 to 544, a RW-line terminal 550 and an S-line terminal 551 are provided as shown in FIG. 5.

Figure 6:
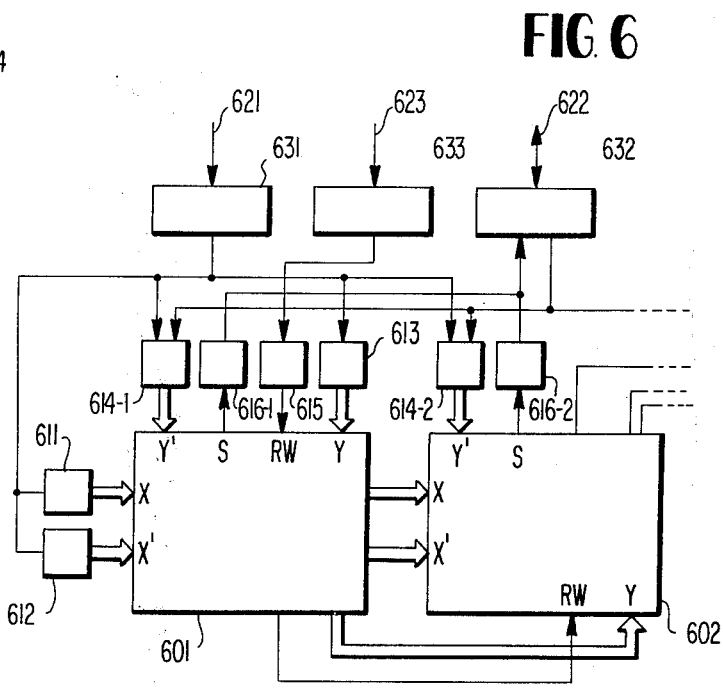
FIG. 6 shows a block diagram of a magnetic domain memory system comprising the memory array shown in FIG. 5.

FIG. 6, the magnetic domain memory system shown comprises a plurality of memory array as shown in FIG. 5, means for feeding signals to each signal line of each memory array, means for detecting signals derived from the signal lines, and control means. Corresponding X-lines, X'-lines, Y-lines and RW lines of memory arrays 601 and 602, respectively, are connected to each other. For example, an $X_1$-line, an $X_1'$-line, a $Y_1$-line and a RW-line of the memory array 601 are respectively connected to an $X_1$-line, an $X_1'$-line, a $Y_1$-line and a RW-line of the memory array 602. The respective X-lines, X'-lines and Y-lines are connected to an X-line selector circuit 611, an X'-line selector circuit 612 and a Y-line selector circuit 613, respectively, each of which generates a gate current in accordance with each address information. The respective Y'-lines of the respective memory arrays 601 and 602 are connected to Y'-line selector circuits 614-1 and 614-2, respectively, each of which generates a signal represented as presence and absence of a gate current depending on address information and write-in information. The RW-line is connected to an RW-line driver circuit 615 for producing a gate current during the write-in operation in accordance with write-read control information. The S-lines of the respective memory arrays are connected to amplifier-shaper circuits 616-1 and 616-2, respectively, each of which amplifies and shapes a detected signal appearing on each S-line. The X-line selector circuit 611 and the X'-line selector circuit 612 feed gate currents to the X-line and X'-line of the units in a particular selected row, while the Y-line selector circuit 613 and the Y'-line selector circuits 614-1 and 614-2 send gate currents to the Y-line and Y'-line of the units in a particular selected column.

Address information fed from external circuits (not shown) is set in an address register 631 via a terminal 621, write-in information similarly fed externally is set in an information register 632 via a terminal 622, read-out information is given from the information register 632 via the terminal 622 to the external circuits, and write-read control information and a master timing signal are applied to a control circuit 633 via a terminal 623. The address information is fed from the address register 631 to the X-line selector circuit 611, X'-line circuit 612, Y-line selector circuit 613, and Y'-line selector circuits 614-1 and 614-2. The write-in information is supplied from the information register 632 to the Y'-line selector circuits 614-1 and 614-2. The write-read control information is given from the control circuit 633 to the RW-line driver circuit 615. In addition, though various timing signals are fed to the respective circuits from the control circuit 633 to which the write-read control information and the master timing signal from the terminal 628 are supplied, these timing signal lines are omitted for simplicity of the drawing.

Then, the operation of the memory system illustrated in FIG. 6 will be described. More particularly, the operation of the system in case that a magnetic domain memory unit located in the second row and in the third column of each memory array is selected, will be described in connection with one memory array 601 with reference to FIGS. 4 and 5.

At first, the operation of writing information in a unit 503 in the second row and in the third column of the memory array 601 will be explained hereinunder. A gate current is fed from the X-line selector circuit 611 to the terminal 512 for the conductors 451 ($X_2$-line) of the units in the same row as the selected unit 503 to open the memory gates 441 to 446, and thereby, the information to be erased which is stored in memory domain postions in the minor loops 411 to 416 of the unit 503 where new information is to be written, is transferred to the major loop 417 of the unit 503. At the same time, the information stored in the memory domain positions in units 501, 502 and 504 (half-selected units) in the same row as the selected unit 503 corresponding to the write-in memory domain positions in the unit 503, are also transferred to the respective major loops. Thereafter, a gate current is supplied from the Y-line selector circuit 613 to the terminal 523 for the conductors 454 ($Y_3$-line) of the units in the same column as the selected unit 503 to open the gates 449, and simultaneously, a gate current is fed from the RW-line driver circuit 615 to the terminal 550 for the conductors 453 (RW-line) of the gates 448 in the domain eraser means of all the units in the array to open the gate 448. Then, the magnetic domains present in the major loop 417 of the selected unit 503 are erased by the domain eraser 433 after they have been propagated along the propagation path 461. Although the gates 449 of half-selected units 505, 506 and 507 in the same column as the unit 503 are opened, the opening of these gates 449 results in no effect since originally no magnetic domain exists in the major loops of these half-selected units 505, 506 and 507 because of the presence of the gate current on the $X_2$-line only. On the other hand, in the half-selected units 501, 502 and 504, the domains in each major loop continue to move round the major loop through the propagation path 460 since the gate 449 remains closed. In this way, the minor loops 411 to 416 of the selected unit 503 are prepared for subsequent storage at particular memory domain positions and also in the major loop 417 of the unit 503, magnetic domains disappear.

While magnetic domains continue to move round the major loops in the half-selected units 501, 502 and 504, a gate current is fed from the X'-line selector circuit 612 to the terminal 432 for the conductors 452' ($X'_2$-line) of the units in the same row as the selected unit 503 to open the gates 447' of the units 501, 502, 503 and 504. Simultaneously, a signal represented by the presence and absence of a gate current in response to 1 and 0 of the write-in information is fed from the Y'-line selector circuit 614-1 to the terminal 543 for the conductors 452'' ($Y'_3$-line) of the units in the same column as the selected unit 503 to open and close the gates 447'' of the units 505, 503, 506 and 507 in accordance with the write-in information. Throughout the above-described process, a series of magnetic domains corresponding to the write-in information enter successively into the major loop 417 of only the selected unit 503, and thereby, the series of magnetic domains are aligned along the major loop. In the half-selected units 501, 502 and 504, however, the input of domains into the major loops would not occur, because the gates 447'' are kept closed although the gates 447' are opened. Also, in the half-selected units 505, 506 and 507 in the same column as the selected unit 503, the input of domains into the major loops would not occur, because the gates 447' are kept closed although the gates 447'' are opened are closed in response to the write-in information. In this way, in the write-in operation, the Y'-line selector circuit 614-1 operates in response to the address information as well as the write-in information. When the series of domains corresponding to the newly written information on the major loop 417 of the selected unit 503 have been propagated up to the positions on the major loop opposed to the minor loops in which the respective magnetic domains are to be stored, a gate current is fed from the X-line selector circuit 611 to the terminal 512 to open the memory gates 441 to 446. As a result, in the selected unit 503, the series of magnetic domains written in the major loop 417 by the input section are inserted into the domain memory positions in the minor loops 411 to 416 which have been previously made vacant. In the half-selected unit 501, 502 and 504, the series of domains propagated round the respective major loops almost by one revolution are stored again in the memory domain positions of the respective minor loops where they were originally stored. Thus, the write-in operation has been completed.

Furthermore, in the operation of reading out information from the selected unit 503, a gate current is supplied from the X-line selector circuit 611 to the terminal 512 for the conductors 451 ($X_2$-line) of the units in the same row as the selected unit 503 to open the memory gates 441 to 446, and as a result, the information stored in the memory domain positions of the minor loops 411 to 416 in the unit 503 is transferred to the major loop 417 for readout. At this time point, the information existing at the memory domain positions in the minor loops 411 to 416 of the units 501, 502 and 504 (half-selected units) in the same row as the selected unit 503 corresponding to those of the minor loops to be read out in the unit 503 are also transferred to the respective major loops 417. Thereafter, when a gate current is sent from the Y-line selector circuit 613 to the terminal 523 for the conductors 454 ($Y_3$-line) of the units in the same column as the unit 503 to open the gates 449, the domains present in the major loop 417 of the selected unit 503 are transferred to the path 461, and after they have been detected by the detector 434 to be converted into electrical signals, they continue to move round the major loop 417. In contrast, in the half-selected units 501, 502 and 504, since the gates 449 are kept closed, the domains existing in the respective major loops merely continue to move around the major loop after they have been transferred to the path 460. Since the propagation period of a magnetic domain along the path 460 is equal to that along the path 461, the respective series of domains propagated along the major loops of the units 501, 502, 503 and 504 almost by one revolution simultaneously come up to the positions on the respective major loops opposed to the corresponding minor loops in which the domains were originally stored. At this moment, if a gate current is fed from the X-line selector circuit 611 to the terminal 512 to open the memory gates 441 to 446 of the respective units 501 to 504, the domains on the respective major loops are stored in the corresponding minor loops 411 to 416. Thus, the read-out operation has been accomplished.

As is apparent from the above-mentioned read-out operation, since only the magnetic domains present in the selected unit 503, which corresponds to the information to be read out are transferred to the domain detector 434, the detection can be achieved even though the conductors 455 for the detectors 434 of all the units in the memory array 601 are connected together. The detected signal voltage is obtained from the terminal 551 for the conductors 455.

In the memory system of FIG. 6 using the memory units shown in FIG. 4, as will be readily appreciated from the write-in operation, the input of unnecessary domains into the major loops of unselected units can be prevented and as a result, the write-in period is reduced. In addition, it will be appreciated from a comparison of the present memory system with the conventional system that in an organization using, for example, 64 units and wherein the number of simultaneously operating units is only one, the conventional memory system as disclosed in Ref. 2 mentioned above requires 66 gate driver circuits 66 gate driver circuits, while the present memory system needs only 33 driver circuits in total, that is, 8 circuits for each of the X-lined selector circuit, X'-line selector circuit, Y-line selector circuit and Y'-line selector circuit, and one RW-line driver circuit. If the conductors for the gate 447'' and the gate 449 in each unit are connected in common to be used on a time division basis, the number of the driver circuits can be further reduced to 25. Thus, in the present magnetic domain memory system, a smaller number of gate driver circuits are needed than in the conventional system, and accordingly, the number of connections between the magnetic domain memory units and the peripheral circuits can be also reduced. In the conventional memory system as disclosed in Reference 1, even in case that the number of simultaneously operating units is only one, if the units are arranged in rows and columns substantially to form a square, the number of the read-out amplifiers is increased although the number of the gate driver circuits is decreased.

Figure 7:
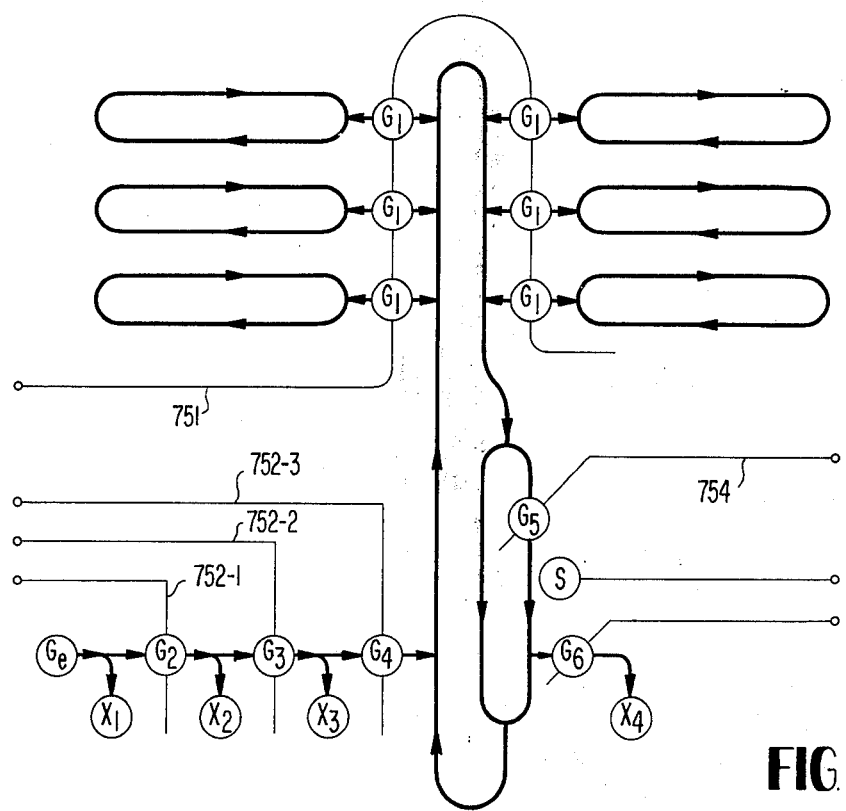
FIG. 7 shows a schematic diagram of a third embodiment of the present invention.

In FIG. 7 which shows a third example of the magnetic domain memory unit, the input section of this modified unit has three signal lines. This is in clear contrast to the unit shown in FIG. 4, in which the input section is provided with two signal lines. A memory array can be also constructed by arranging a plurality of these modified units in the row-column arrangement. A detailed description of the magnetic domain memory system employing the memory arrays will be omitted and only the distinction thereof from the above-described embodiments of the present invention will be clarified herinunder. One difference in the manner of wiring between the units in one of these memory arrays and those shown in FIG. 5 lies in that the third signal lines in the input sections of all the units of FIG. 7 are electrically connected together. Moreover, another difference between the magnetic domain memory system employing the units of FIG. 7 and that shown in FIG. 6 exists in that signals based on address information are applied to a first signal line 752-1 and a second signal line 752-2 in the input section, while a signal based on write-in information is applied to a third signal line 752-3 in the input section. Whether the second magnetic domain memory unit shown in FIG. 4 is employed or the third magnetic domain memory unit shown in FIG. 7 is employed, is determined on the basis of the complexity of the unit and the number of peripheral circuits.

While the number of the minor loops is selected to be six in the units illustrated in FIGS. 1, 4 and 7, the number of the minor loops is never limited to this particular number. Moreover, even if the relative positioning of the component elements of a unit should be somewhat modified from the chip construction of the unit illustrated in these figures, the input and output sections included in the present unit could be integrally assembled in the same chip. Furthermore, although the number of units is chosen to be 16 in the memory arrays illustrated in FIGS. 2 and 5, the number of the units should not be limited to this specific number.

Generally, almost all of the signal lines of the input and output sections of the memory unit according to the present invention are for the gate conductors except the conductor for the domain detector. However, it is to be noted that the signal lines are not necessarily the gate conductors. For instance, in the input section of the unit shown in FIG. 1, the generation of a magnetic domain can be controlled by electric currents flowing through two conductors 152' and 152". In this case, if a domain generator adapted to generate the magnetic domain when electric currents are fed to both of two external conductors is employed, then the two external conductors serve as the first and second signal lines in the input section. In such a case, the domain erasers 132' and 132" and the gates 147' and 147" become unnecessary. Still further, in the output section, the domain eraser means consisting of the gate 148 and the domain eraser 133 can be substituted by a pair of conductors to directly erase a magnetic domain with electric currents flowing through these conductors.

Although the respective gate conductors are provided individually for each gate in the magnetic domain memory units illustrated in FIGS. 1, 4 and 7, it is also possible to actuate a plurality of gates with a single conductor on a time division basis. For example, in the unit shown in FIG. 7, the conductor 752-2 for a gate 747-2 and a conductor 754 for a gate 749 are electrically connected together so as to be fed with a current from a single driver circuit, and which one of the gates is to be switched ON, can be determined by the timing for feeding the current.

Moreover, though the units comprising the memory arrays illustrated in FIGS. 2 and 5 are arranged in a plane in order to clearly represent the wiring of the signal lines between the units, they may be piled up in a physical configuration. Also, the signal lines within a memory array may be sometimes divided in view of a restriction imposed by the peripheral circuits. For instance, in the memory array illustrated in FIG. 5, the RW-line and/or the S-line may be possibly divided into two lines, respectively.

The details of the construction and component circuits of each magnetic domain memory system shown in FIGS. 3 and 6 are omitted from the specification and drawings, because such construction and circuits are not different from those of the conventional memory system. Various modifications could be made with reference to the construction of the illustrated present magnetic domain memory system.

It should be noted that means for applying a biasing magnetic field substantially normal to the plane of the sheet in order to keep the domains at a predetermined size and means for generating a magnetic field rotating in the plane of the sheet so as to propagate the domains and the overlay (for instance, TI patterns) of magnetic material for defining the propagation paths for the major loop (117 of FIG. 1) and the minor loops (111 to 116 of FIG. 1) an other paths represented by thick solid lines are omitted from the drawings because the operations of these means have no direct bearing on the subject matter of this invention. However, these well-known means are disclosed in a paper titled MAGNETIC BUBBLES published in SCIENTIFIC AMERICAN, Vol. 224, No. 6, Pages 78 to 90, June issue 1971.

While the present invention has been described above in connection with the magnetic domain memory unit represented by the cylindrical magnetic domain memory element and the magnetic domain memory system employing the same units, it will be understood that the present invention can be practiced by employing memory elements other than the cylindrical domain memory elements such as, for example, magnetic domain elements having magnetization in the plane of the sheet of magnetic material.

I claim:

1. A magnetic memory unit of a major-minor loop construction comprising: a sheet of magnetic material capable of retaining and moving magnetic domains; a magnetically soft overlay for defining a major loop and a plurality of minor loops; means for selectively transferring the domains between the major loop and the minor loops; an input section having a plurality of signal lines and memory gates connected thereto for selectively feeding the domains to the major loop; an output section including means for selectively erasing the domains in the major loop and for detecting the presence and absence of the domains in the major loop; and means for providing a rotating magnetic field to the sheet to propagate the domains on the sheet.

2. The magnetic memory unit as claimed in Claim 1 in which said output section further includes a plurality of parallel domain propagation paths provided in the major loop, domain detector means and domain eraser means coupled to one of the propagation paths, and control means for allowing domains to be transferred to one of the plurality of parallel propagation paths.

3. A magnetic domain memory system comprising:
 a. a memory array formed of a plurality of magnetic domain memory units of a major-minor loop construction, each of said memory units including an input section having a plurality of signal lines and memory gates connected thereto for selectively feeding magnetic domains into the major loop and an output section including means for selectively erasing the magnetic domains in the major loop and for detecting the presence and absence of the domains in the major loop;

b. first means for feeding signals to the plurality of signal lines of the input sections in selected magnetic domain memory units in accordance with address information and write-in information so that magnetic domains may enter from the input sections into the major loops of the selected memory units;

c. second means for supplying signals to the memory gates in the selected memory units in accordance with the address information;

d. third means for detecting signals fed from the commonly connected domain detector means of the selected magnetic domain memory units and unselected magnetic domain memory units;

e. fourth means for feeding signals to the domain eraser means in accordance with information for controlling write-in and read-out operations, the domains eraser means of the plurality of magnetic domain memory units being connected in common; and f. control means for controlling the first to fourth means.

4. A magnetic domain memory system comprising:

a. at least one memory array formed of a plurality of magnetic domain memory units of a major-minor loop construction, each of said memory units including an input section having a plurality of signal lines and memory gates connected thereto for selectively feeding magnetic domains into the major loop and an output section including a plurality of parallel domain propagation paths provided in the major loop, domain detector means and domain eraser means coupled to one of the propagation paths, and control means for allowing domains to be transferred to one of the plurality of parallel propagation paths;

b. first means for feeding signals to the plurality of signal lines of the input sections in the magnetic domain memory units, one of which has been selected for each said memory in accordance with address information and write-in information so the magnetic domains may enter from the input sections into the major loops in the selected magnetic domain memory units;

c. second means for giving signals to the memory gates and the control means in the output sections of the magnetic domain memory units in accordance with the address information so that magnetic domains may be transferred to each domain propagation path including the domain detector means and the domain eraser means in the output sections of the selected magnetic domain memory units;

d. third means for detecting signals fed from the domain detector means in the output sections which are connected in common among the plurality of magnetic domain memory units for each said memory array;

e. fourth means for feeding signals to the domain eraser means in accordance with information for controlling write-in and readout operations the domain eraser means of the plurality of magnetic domain memory units being connected in common; and f. control means for controlling the first to fourth means.

5. An information storage system comprising:

a two-dimensional memory array composed of a plurality of memory units arranged electrically in rows and columns, each of said memory units comprising, a sheet of magnetic material in which magnetic domains are moved in response to propagation fields, means for defining a major loop in said sheet, means for defining a plurality of minor loops in said sheet, means for selectively transfering magnetic domains between said major loop and said plurality of minor loops, input means having at least two signal lines and arranged to allow magnetic domains to be fed to said major loop only when said at least two signal lines are simultaneously enabled, and output means for detecting the presence and absence of magnetic domains in said major loop and for annihilating magnetic domains in said major loop;

a plurality of memory select lines, one for each row of said memory units; each said memory select line consisting of the series connection of the first one of said signal lines for each memory unit in the corresponding row;

a plurality of bit select lines, one for each column of said memory units; each said bit select line consisting of the series connection of the second one of said signal lines for each memory unit in the corresponding column; and means for selectively activating any one or more of said memory select and bit select lines to write desired bits in selected memory units without effecting the other unselected memory units.

6. The arrangement of claim 5, wherein said input means includes at least two gates each connected to the respective one of said at least two signal lines for selectively controlling the flow of magnetic domains into said major loop.

7. The arrangement of claim 6, wherein said at least two gates are connected in series between a magnetic domain generator and said major loop.

8. The arrangement of claim 7 wherein each of said at least two gates has an eraser connected to its input for annihilating magnetic domains when the gate is not enabled.

9. An information storage system comprising:

a two-dimensional memory array composed of a plurality of memory units, said memory units each being of a major-minor loop construction and including input means having at least two signal lines, said input means being arranged to allow magnetic domains to be supplied to the major loop only when said at least two signal lines are simultaenously enabled, said memory units further comprising means for defining at least two parallel propagation paths in said major loop and gate means for selectively directing magnetic domains to one of said at least two parallel propagation paths;

means for enabling a first one of said at least two signal lines of each memory unit located in a selected row of said two-dimensional memory array;

means for enabling a second one of said at least two signal lines of each memory unit located in a selected column of said two-dimensional memory array; and means for enabling said gate means of each memory unit located in the selected column of said two-dimensional memory array.

10. An information storage arrangement comprising: a sheet of magnetic material in which magnetic domains are moved in response to propagation fields, means for defining a major loop in said sheet, means for defining a plurality of minor loops in said sheet, means for selectively transferring magnetic domains between said major loop and said plurality of minor loops, input means having at least two signal lines and arranged to allow magnetic domains to be fed to said major loop only when said at least two signal lines are simultaneously enabled, means for defining at least two parallel propagation paths in said major loop, gate means for selectively directing magnetic domains to one of said at least two propagation paths, means for detecting the presence and absence of magnetic domains in one of said at least two propagation paths, and means for annihilating magnetic domains in one of said at least two propagation paths.

11. The arrangement of claim 10 wherein said at least two parallel propagation paths have the same length.

* * * * *

UNITED STATES PATENT AND TRADEMARK OFFICE
CERTIFICATE OF CORRECTION

PATENT NO. : 3,944,991
DATED : March 16, 1976
INVENTOR(S) : Hiroshi Murakami

It is certified that error appears in the above-identified patent and that said Letters Patent are hereby corrected as shown below:

Column 1, line 26 - Insert quotes before and after Bubble Domain Memory Chips
    line 45 - delete "has been desired such that"
    line 45 - before "a novel chip" insert -- a need exists for --
    line 46 - delete "has been desired such that"
    line 48 - after "operation" insert a period
    line 55 - delete "B". and insert -- $\sqrt{B}$ . --
    line 59 - after "construction" insert -- that --
    line 60 - after "units" delete "that"

Column 2, line 9 - after "data" insert -- transfer --
    line 52 - after "prevented" insert a comma
    line 62 - delete "plane on" and insert -- array in --
    lines 67-68 - "FIG. 4 shows...invention;" should be a separate paragraph.

Column 3, line 32 - delete "eraser" and insert --erasers --

Column 4, line 26 - delete "plane"
    line 39 - after "all" insert -- the --

Column 5, line 8 - delete "signals" and insert -- signal lines--
    line 14 - after "operation," insert -- at first --
    line 16 - before "$X_2$" insert --(--
    line 18 - delete "and" and insert -- to --
    line 36 - after "currents" insert a comma

UNITED STATES PATENT AND TRADEMARK OFFICE
CERTIFICATE OF CORRECTION

PATENT NO. : 3,944,991
DATED : March 16, 1976
INVENTOR(S) : Hiroshi Murakami

It is certified that error appears in the above-identified patent and that said Letters Patent are hereby corrected as shown below:

Column 5, line 40 - after "Then," insert -- the --
          line 64 - delete "and" and insert -- to --

Column 6, line 9 - delete "circui" and insert -- circuit --
          line 21 - after "form" insert -- the --
          line 29 - delete "eliminated" insert -- prevented --
          line 47 - after "signal" insert -- line --
          line 63 - delete "write-out" insert -- write-in --

Column 7, line 31 - before "FIG. 6" insert -- In --
          line 32 - delete "array" and insert -- arrays --

Column 8, line 6 - after "X'-line" insert -- selector --
          line 67 - after "positions" insert a comma Column 9, line 27 - delete "are" (second occurrence)
                    insert -- and --

Column 10, line 42 - delete "66 gate driver circuits (first occurrence)
           line 56- delete "1" and insert -- 2 --

Column 11, line 31 - between "of" and "units" insert -- the --

Column 12, line 30 - after "issue" insert a comma

Column 13, line 46 - after "memory" insert -- array --

UNITED STATES PATENT OFFICE
CERTIFICATE OF CORRECTION

Patent No. 3,944,991　　　　　　　　　　Dated　March 16, 1976

Inventor(s)　Hiroshi Murakami

It is certified that error appears in the above-identified patent and that said Letters Patent are hereby corrected as shown below:

Column 13, line 48, before "magnetic" delete "the" and insert -- that -- line 67, delete "readout" insert -- read-out -- line 67, after "operations" insert a comma

This certificate supersedes Certificate of Correction issued August 3, 1976.

Signed and Sealed this

Nineteenth Day of October 1976

[SEAL]

Attest:

RUTH C. MASON  
Attesting Officer

C. MARSHALL DANN  
Commissioner of Patents and Trademarks